United States Patent
Matsui et al.

(10) Patent No.: US 8,490,857 B2
(45) Date of Patent: Jul. 23, 2013

(54) REFLOW APPARATUS, A REFLOW METHOD, AND A MANUFACTURING METHOD OF A SEMICONDUCTOR DEVICE

(75) Inventors: Hiroyuki Matsui, Kawasaki (JP); Hirohisa Matsuki, Kawasaki (JP); Koki Otake, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/436,843

(22) Filed: Mar. 31, 2012

(65) Prior Publication Data

US 2012/0187181 A1    Jul. 26, 2012

Related U.S. Application Data

(62) Division of application No. 11/361,041, filed on Feb. 24, 2006.

(30) Foreign Application Priority Data

Nov. 2, 2005   (JP) .................................. 2005-319819

(51) Int. Cl.
  *B23K 1/00*   (2006.01)
  *H01L 21/44*  (2006.01)

(52) U.S. Cl.
  USPC ............... 228/220; 228/42; 228/33; 228/219; 438/612; 438/613

(58) Field of Classification Search
  USPC ..... 228/42, 214, 219, 220, 223; 438/612–613
  See application file for complete search history.

(56) References Cited

U.S. PATENT DOCUMENTS

| | | | |
|---|---|---|---|
| 3,839,051 A | 10/1974 | Cerveny | |
| 5,043,211 A | 8/1991 | Yoshizumi et al. | |
| 5,048,746 A | 9/1991 | Elliott et al. | |
| 5,874,178 A | 2/1999 | Takayasu | |
| 6,135,344 A * | 10/2000 | Sakuyama et al. | 228/234.1 |
| 6,227,437 B1 | 5/2001 | Razon et al. | |

(Continued)

FOREIGN PATENT DOCUMENTS

| EP | 0285450 | 10/1998 |
|---|---|---|
| JP | 8-056071 A | 2/1996 |

(Continued)

OTHER PUBLICATIONS

"Japanese Office Action", mailed by JPO and corresponding to Japanese application No. 2005-319819 on Mar. 15, 2011, with partial English translation.

(Continued)

*Primary Examiner* — Devang R Patel
(74) *Attorney, Agent, or Firm* — Fujitsu Patent Center (57) ABSTRACT

A reflow apparatus, where formic acid is used for cleaning a surface of a solder electrode on a processing target, is disclosed. The reflow apparatus includes a processing chamber, a formic acid introduction mechanism for supplying an atmosphere gas containing formic acid to the processing chamber, and a shielding member that is made of a material having corrosion resistance against formic acid. The shielding member is arranged between a reflow processing section of the processing chamber and an inner wall of the processing chamber. In place of or in addition to the shielding member, the reflow apparatus may include a heater for decomposing residual formic acid.

5 Claims, 10 Drawing Sheets

U.S. PATENT DOCUMENTS

| | | |
|---|---|---|
| 6,331,212 B1 | 12/2001 | Mezey |
| 6,344,407 B1 | 2/2002 | Matsuki et al. |
| 6,386,433 B1 | 5/2002 | Razon et al. |
| 6,535,274 B2 | 3/2003 | Antoni |
| 6,634,545 B2 | 10/2003 | Razon et al. |
| 2005/0255685 A1* | 11/2005 | Zhang .......................... 438/613 |

FOREIGN PATENT DOCUMENTS

| | | |
|---|---|---|
| JP | 2001-102158 A | 4/2001 |
| JP | 2001-176645 A | 6/2001 |
| JP | 2001-244618 | 9/2001 |
| JP | 2003-243502 A | 8/2003 |
| TW | 087277 | 5/1987 |
| TW | 464581 | 11/2001 |

OTHER PUBLICATIONS

"Taiwanese Office Action" in Taiwanese Application No. 95106369, dated Oct. 23, 2008, with English translation.

"Search Report of Taiwanese Application No. 95106369", dated Sep. 9, 2007, with English translation.

Office Action issued Jul. 4, 2008, in corresponding Chinese Patent Application No. 2006100718046.

USPTO, (Patel) Non-Final Rejection, Oct. 21, 2011, in U.S. Appl. No. 11/361,041 [pending].

USPTO, (Patel) Final Rejection, Apr. 14, 2011, in U.S. Appl. No. 11/361,041 [pending].

USPTO, (Patel) Non-Final Rejection, Aug. 31, 2010, in U.S. Appl. No. 11/361,041 [pending].

USPTO, (Patel) Final Rejection, Mar 4, 2010, in U.S. Appl. No. 11/361,041 [pending].

USPTO, (Patel) Non-Final Rejection, Jul. 6, 2009, in U.S. Appl. No. 11/361,041 [pending].

USPTO, (Patel) Final Rejection, Jan. 7, 2009, in U.S. Appl. No. 11/361,041 [pending].

USPTO, (Patel) Non-Final Rejection, Jun. 16, 2008, in U.S. Appl. No. 11/361,041 [pending].

USPTO, (Roman) Restriction Requirement, Apr. 7, 2008, in U.S. Appl. No. 11/361,041 [pending].

USPTO [Patel] Notice of Allowance, May 24, 2012, in U.S. Appl. No. 11/361,041 [allowed].

* cited by examiner

| | Ni | Cr | Co | Mo | W | Fe | Mn | Si | C | OTHERS | RESULT |
|---|---|---|---|---|---|---|---|---|---|---|---|
| HASTELLOY C-22 | 51.6 | 21.5 | 2.5 | 13.5 | 4.0 | 5.5 | 1.0 | 0.1 | 0.01 | 0.3V | ○ |
| SUS316L | 12.0~15.0 | 16.0~18.0 | — | 2.5 | — | >64.0 | — | — | <1.0 | — | ○ |
| SUS304 | 8.0~10.5 | 18.0~20.0 | — | — | — | >69.5 | — | — | — | — | ○ |
| SUS303 | 8.0~10.0 | 17.0~19.0 | — | — | — | >71.0 | — | — | — | 0.1C-S>0.15 | × |
| Ni PLATED Cu | >99.0 | — | — | — | — | — | — | — | — | — | × |

REFLOW APPARATUS, A REFLOW METHOD, AND A MANUFACTURING METHOD OF A SEMICONDUCTOR DEVICE

BACKGROUND OF THE INVENTION

1. Field of the Invention

The present invention generally relates to a reflow apparatus for fusing and shaping a solder electrode formed on a semiconductor wafer, and the like; and especially relates to a corrosion prevention technology for a chamber material in a fluxless reflow apparatus wherein a solder electrode is fused and shaped without using flux.

2. Description of the Related Art

A fluxless reflow apparatus is proposed (for example, Patent Reference 1) wherein a solder bump is formed by removing a surface oxide film of a solder electrode using the reduction power of formic acid without using flux in manufacturing a flip chip LSI.

Since flux is not used, according to the fluxless reflow apparatus, a flux washing process that requires an organic solvent for cleaning the solder bump surface after reflow becomes unnecessary, and a manufacturing process can be shortened. Further, by dispensing with the flux washing process currently performed using a great amount of organic solvents, an adverse effect on the environment, especially generating carbon dioxide, can be eliminated.

According to the fluxless reflow apparatus of Patent Reference 1, thermal reflow is performed under reduced pressure. For this reason, almost no gas is taken into the solder bump, and a void is prevented from being produced. Therefore, the reliability of the solder bump is improved.

Figure 1:
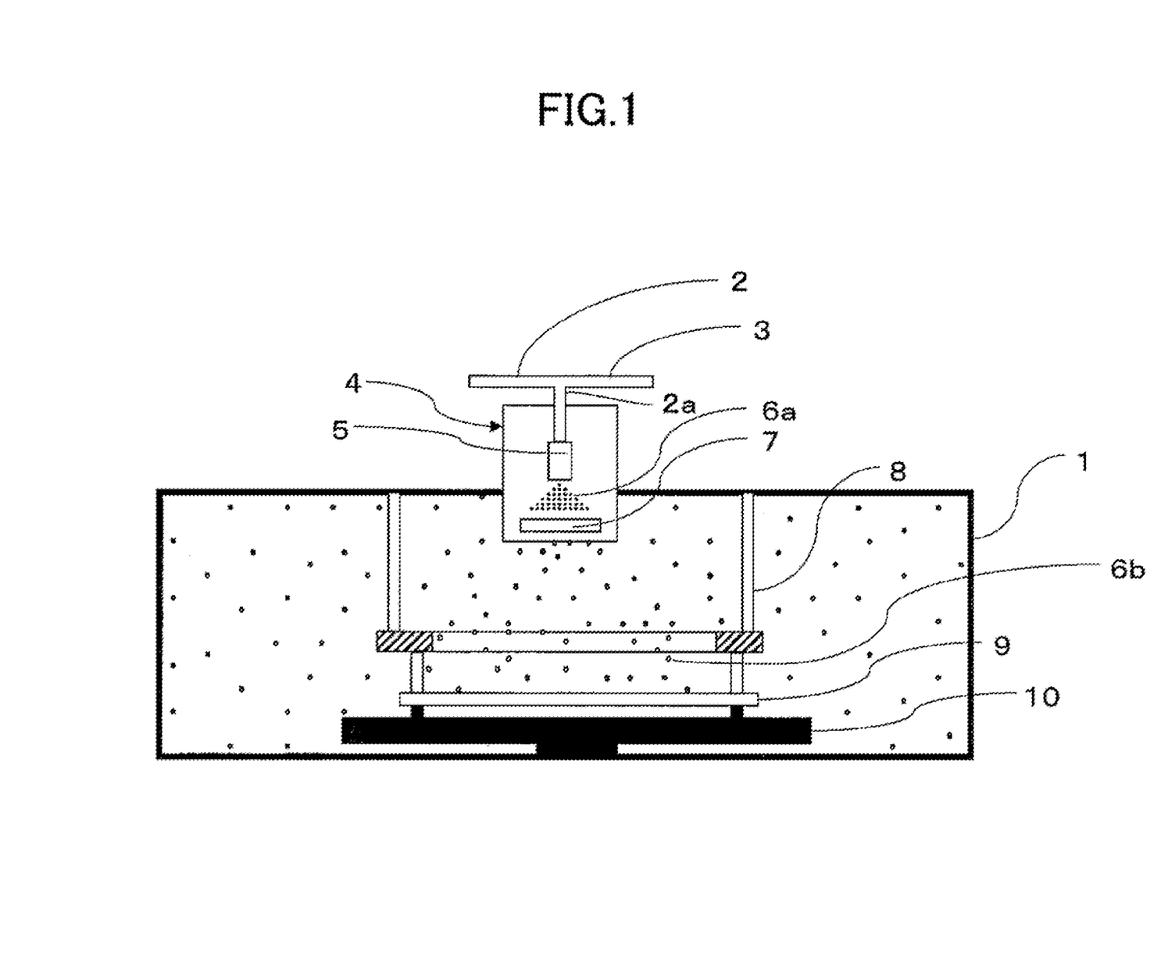
FIG. 1 is a cross-sectional diagram of a conventional reflow apparatus.

FIG. 1 shows an outline of a conventional reflow apparatus.

The reflow apparatus has a processing chamber 1 for performing a thermal fusion reflow process, and a formic acid injection mechanism 4.

To the formic acid injection mechanism 4, formic acid in a liquid state is provided through a formic acid introduction pipe 2, and inert gas, such as nitrogen ($N_2$) and argon (Ar), is provided through an inert gas introduction pipe 3.

The introduced formic acid solution and the inert gas are mixed in a spraying nozzle 5, and formic acid atmosphere mist 6a is sprayed from the spraying nozzle 5. The mist state is maintained by an auxiliary heater 7 so that evaporation is promoted, and the sprayed formic acid atmosphere mist 6a is introduced into the processing chamber 1.

In the processing chamber 1 is arranged a semiconductor wafer 9 (wafer) on the surface of which a solder electrode is formed. The wafer 9 is held above a main heater 10 for heating the wafer 9, and is fixed by a wafer fixing mechanism 8. Since the processing chamber 1 is heated by the main heater 10, and is evacuated by an exhausting apparatus (not illustrated), the introduced formic acid atmosphere mist 6a is diffused onto the wafer 9 as formic acid atmosphere gas 6b.

[Patent reference 1] JPA 2001-244618

DESCRIPTION OF THE INVENTION

Problem(s) to be Solved by the Invention

The processing chamber 1 is generally made of stainless steel SUS304 mainly consisting of steel (Fe), nickel (Ni), and chromium (Cr), where SUS304 is deficient in corrosion resistance to formic acid over a long period. Especially, in thermal fusion processing of reflow, and the like, a part of formic acid drops adhering to the inner wall of the processing chamber 1 consisting of SUS304 is not volatilized, and causes corrosion of the chamber material; the corrosion becomes solid, and residue becomes remarkable.

If the residue accumulates, it becomes a pollution source in the chamber as a metal foreign substance. The metal foreign substance may be scattered and adhered to a processing target, such as electronic parts mounted on the circuit board and an integrated circuit (LSI) element section formed on the semiconductor wafer. That degrades the quality of the processing target, and the long-term stability of the reflow apparatus.

As countermeasures to solve the problem, it is conceivable that the chamber be periodically cleaned and that the formic acid be evaporated within a container without injecting drops. However, they are not lasting solutions.

The present invention may provide a reflow apparatus and a manufacturing method of a semiconductor device using the reflow apparatus, which substantially obviate one or more of the problems caused by the limitations and disadvantages of the related art. The reflow apparatus has durability for a thermal fusion process using formic acid for a long period, the apparatus being capable of manufacturing high quality products.

Features of embodiments of the present invention are set forth in the description that follows, and in part will become apparent from the description and the accompanying drawings, or may be learned by practice of the invention according to the teachings provided in the description. Problem solutions provided by an embodiment of the present invention will be realized and attained by a reflow apparatus and a manufacturing method of a semiconductor device using the reflow apparatus particularly pointed out in the specification in such full, clear, concise, and exact terms as to enable a person having ordinary skill in the art to practice the invention.

To achieve these solutions and in accordance with an aspect of the invention, as embodied and broadly described herein, an embodiment of the invention provides a reflow apparatus and a manufacturing method of a semiconductor device using the reflow apparatus as follows.

SUMMARY OF THE INVENTION

In order to solve the problem, the embodiment of the present invention provides a shielding member in a processing chamber of the reflow apparatus for fusing solder while supplying an atmosphere gas containing formic acid to the processing chamber, the shielding member having excellent corrosion resistance against the formic acid; and provides a thermolysis processing unit near an inner wall of the processing chamber for decomposing residual formic acid in the processing chamber. By adopting at least one of the two items described above, corrosion of the processing chamber is prevented. Thereby, scattering and adhesion onto a processing target of a metal foreign substance are prevented.

An aspect (first aspect) of the present invention provides a reflow apparatus for performing a reflow process on a solder member formed on the processing target, the reflow apparatus including a processing chamber, a formic acid introduction mechanism for providing atmosphere gas containing formic acid to the processing chamber, and a shielding member that has corrosion resistance over (against) formic acid, the shielding member being provided between a reflow process section of the processing chamber and a wall of the processing chamber.

Another aspect (second aspect) of the present invention provides a reflow apparatus for performing a reflow process on a solder member formed on the processing target, the reflow apparatus including a processing chamber, a formic acid introduction mechanism for providing atmosphere gas containing formic acid to the processing chamber, and a thermolysis processing unit for decomposing the formic acid, the thermolysis processing unit being provided between the reflow process section of the processing chamber and the wall of the processing chamber.

By using the reflow apparatus according to either the first aspect or the second aspect of the present invention, corrosion of the chamber material by formic acid can be prevented, and scattering of a reaction product (metal foreign substance) onto the processing target can be avoided.

Further, the reflow apparatus may be equipped with both of the thermolysis processing unit for decomposing the formic acid and the shielding member that has the corrosion resistance over the formic acid as a highly recommendable configuration. In this case, the thermolysis processing unit is arranged between, for example, the shielding member and the wall of the processing chamber.

The shielding member is made of, for example, one of a metal material including Hastelloy® and SUS316L, a resin material including epoxy resin and polyimide resin, and a material coated by thermally resistant Teflon® and poly olefin.

Another aspect (third aspect) of the present invention provides a reflow method of a solder member. The reflow method includes steps of (a) heating a processing target, such as a substrate, on which the solder member is formed, (b) supplying an atmosphere gas containing formic acid onto the processing target when the processing target reaches a first temperature, (c) carrying out a fusion process on the solder member when the processing target reaches a second temperature, the second temperature being maintained, and (d) starting a thermolysis process of decomposing the formic acid when the fusion of the solder member is completed.

Another aspect (fourth aspect) of the present invention provides the manufacturing method of a semiconductor device, the manufacturing method including a reflow process. The manufacturing method of the semiconductor device includes steps of (a) placing and heating the processing target on which a solder electrode is formed at a predetermined position in the processing chamber, (b) supplying the atmosphere gas containing formic acid to the processing chamber when the processing target reaches the first temperature, (c) forming a solder electrode into a solder bump by fusing when the processing target reaches the second temperature, and (d) starting the thermolysis process of decomposing the formic acid after forming the solder bump, and lowering the temperature of the processing target to the first temperature.

EFFECT OF THE INVENTION

Producing and scattering a metal foreign substance due to corrosion caused by the formic acid can be prevented, and a high quality and stabilized product can be manufactured.

DESCRIPTION OF THE PREFERRED EMBODIMENTS

In the following, embodiments of the present invention are described with reference to the accompanying drawings.

Figure 2:
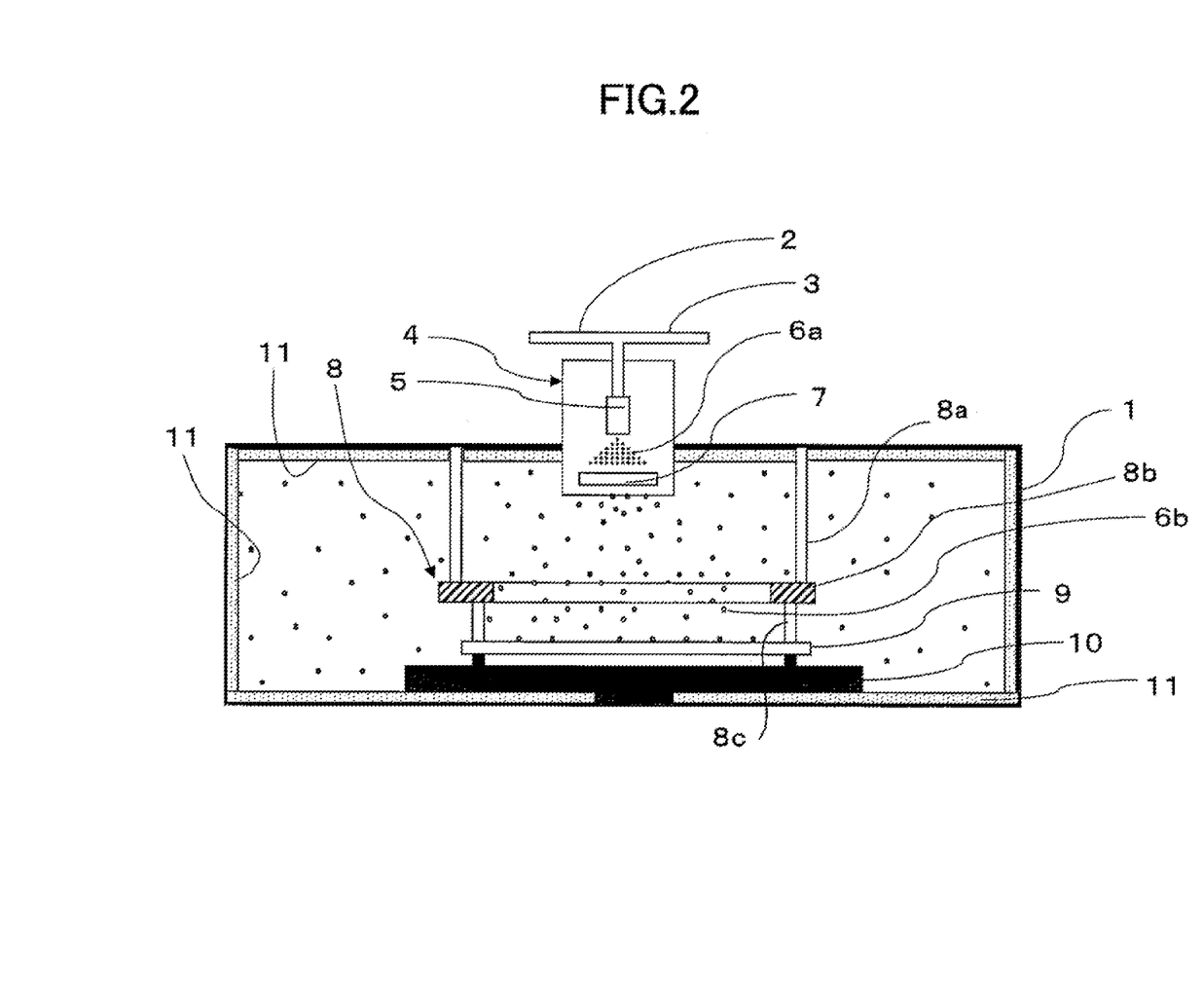
FIG. 2 is a cross-sectional diagram of a reflow apparatus according to the first embodiment of the present invention.

FIG. 2 shows a reflow apparatus according to the first embodiment of the present invention.

The reflow apparatus according to the first embodiment includes a processing chamber 1 wherein a reflow process is carried out, a formic acid spray mechanism (formic acid introduction mechanism) 4 for supplying an atmosphere gas containing formic acid to the processing chamber 1, and a shielding member 11 prepared near the surface of an inner wall (inner wall surface) of the processing chamber 1.

The shielding member 11 is made of a material that has corrosion resistance to the powerful corrosion effect of the formic acid.

The shielding member 11 is made of, for example, a metal material, such as Hastelloy and SUS316L, and a heat-resistant resin, such as epoxy resin and polyimide resin. Alternatively, the shielding member 11 may be made of a metal plate of such as SUS304 that is coated by poly olefin or heat-resistant Teflon.

The formic acid in the liquid state is introduced into the formic acid injection mechanism 4 from a formic acid introduction pipe 2. On the other hand, inert gas, such as nitrogen (N) and argon (Ar), is introduced into the formic acid injection mechanism 4 from an inert gas introduction pipe 3.

The formic acid solution and inert gas are mixed in a spraying nozzle 5, and mist-like formic acid atmosphere gas 6a is injected from the spraying nozzle 5. The mist state is maintained by an auxiliary heater 7 and evaporation is promoted, and the sprayed formic acid atmosphere mist 6a is supplied to a processing target arranged in the processing chamber 1.

The processing target is a semiconductor wafer 9 (wafer) in this embodiment, and is arranged in the processing chamber 1. The wafer 9 has a solder electrode formed on its surface. The wafer 9 is held above a main heater 10 for heating the wafer, and is fixed by a wafer fixing mechanism 8. Since the processing chamber 1 is heated by the main heater 10, and is evacuated by an exhaust unit, which is not illustrated, the introduced formic acid mist 6a is diffused on the wafer 9 as formic acid atmosphere gas 6b.

The wafer fixing mechanism 8 includes two or more support rods 8a supported by an upper part of the processing chamber 1, a frame 8b supported by the support rods 8a, and two or more control rods 8c prolonged from the frame 8b. The control rods 8c can be moved vertically by an air cylinder mechanism (not shown). Further, the support rods 8a include spring mechanisms (not shown) for elastically pressing the wafer 9. The frame 8b is made in the shape of one of a rectangle and a ring. The formic acid mist 6a is provided on the wafer 9 through a central part aperture of the frame 8b.

In addition, although illustration is omitted, the reflow apparatus as a general configuration includes a preheating chamber for warming the wafer 9 to a predetermined temperature beforehand, and a cooling chamber for cooling down the wafer 9 after the reflow process. Further, the reflow apparatus includes a conveyance chamber equipped with a robot arm for conveying the semiconductor wafer to and from the processing chamber 1, a load lock (L/L) chamber for accommodating a cassette that holds the wafer 9 (processing target), and the like. Since these items (preheating chamber, cooling chamber, conveyance chamber, and load lock chamber) are not directly concerned with the present invention, explanations thereof are omitted.

According to the reflow apparatus of the first embodiment of the present invention as described above, since the shielding member 11 is arranged near the inner surface of the wall of the processing chamber 1, diffused formic acid atmosphere gas 6b does not directly adhere to the inner wall surface of the processing chamber 1. Further, since the corrosion resistance of the shielding member 11 is high, a metal foreign substance due to corrosion is not produced even if the formic acid in the liquid state remains on the shielding member 11.

Figure 3:
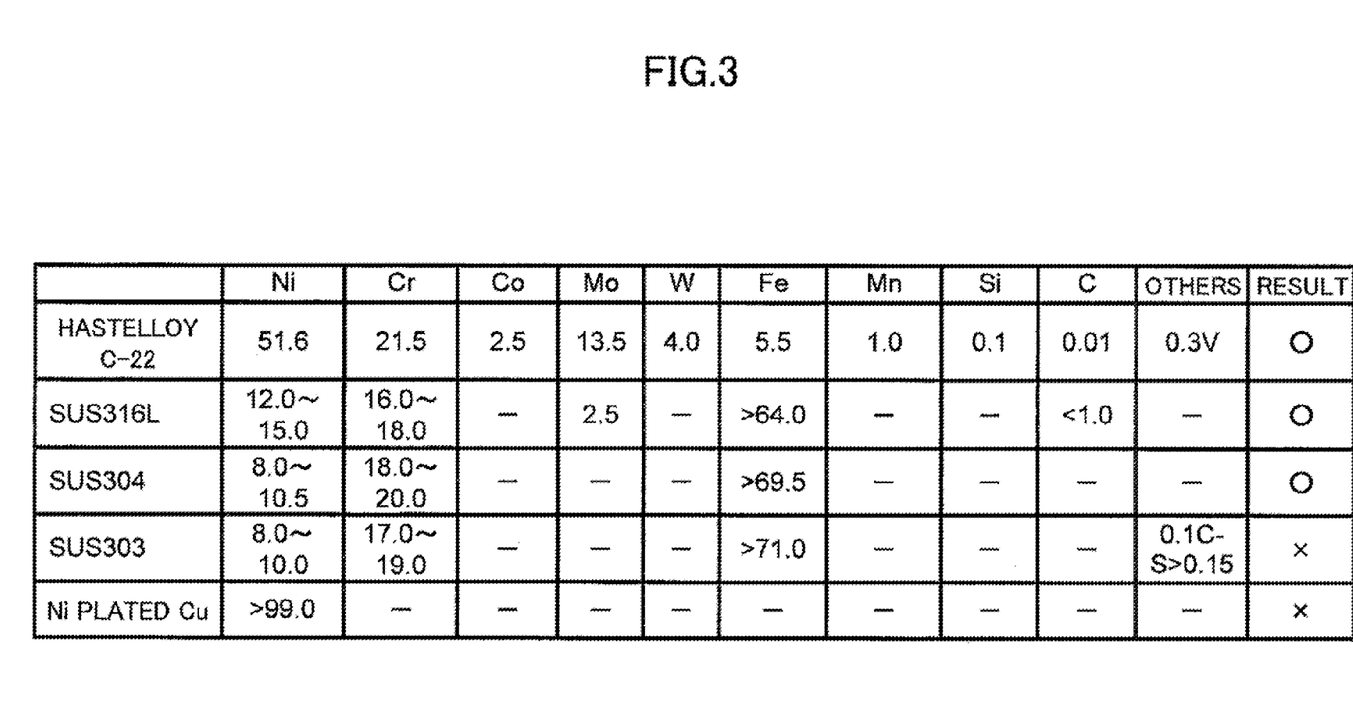
FIG. 3 is a table showing test results of corrosion resistance of metal materials to be used as a shielding member of the reflow apparatus of FIG. 2.

FIG. 3 shows results of corrosion-resistance tests, Test 1 and Test 2, conducted on various metal materials in order to determine a metal material suitable for the shielding member 11.

In Test 1, sample metal pieces were immersed in 85% formic acid; then rate measurements of mass change and appearance observation before and after immersing were performed. Immersing conditions were: formic acid temperature at room temperature; immersing time 48 hours; and drying time after immersing 24 hours. Results of Test 1 were as follows.

(1) Ni plated Cu: the rate of mass reduction due to corrosion was 0.085%; the Ni plating was exfoliated; and a reaction (copper rust) with Cu occurred. Accordingly, determination was NG.

(2) SUS304: No mass change and no appearance change. Accordingly, determination was OK.

(3) SUS316L: No mass change and no appearance change. Accordingly, determination was OK.

(4) Hastelloy C-22: No mass change and no appearance change. Accordingly, determination was OK.

Then, Test 2 was conducted on the samples other than Ni-plated Cu. The samples were immersed in the 85% formic acid under different conditions, and rate measurement of mass change and appearance observation before and after being immersed were performed. The conditions were: the temperature of the formic acid 80° C., immersing time 45 hours, and drying time after immersing 24 hours. Results of Test 2 were as follows.

(1) SUS303: the mass decreased by 1.97%, a solid foreign substance white in color was generated on the surface of the sample. Accordingly, determination was NG.

(2) SUS316L: No mass change and no appearance change. Accordingly, determination was OK.

(3) Hastelloy C-22: No mass change and no appearance change. Accordingly, determination was OK.

From the results above and as shown in FIG. 3, Hastelloy C-22 and SUS316L were determined to have high corrosion resistances, i.e., suitable for the shielding member 11. Although SUS304 can be used as the shielding member 11, its corrosion resistance may be degraded over a long period of use in the reflow apparatus employing thermal fusion.

As described above, when a metal material is used as the shielding member 11, Hastelloy C-22 and SUS316L are desirable. Since Hastelloy C-22 is an expensive material, if the entire processing chamber 1 is built with this material, the cost of the reflow apparatus increases. Accordingly, by fabricating the shielding member 11 around the inner wall using Hastelloy C-22, the corrosion resistance to the formic acid can be economically improved without vastly changing the structure of the conventional processing chamber and/or the manufacturing process.

The shielding member 11 can be made of a resin material such as an epoxy resin and a polyimide resin that is less expensive and easier to process than metal materials. Further, the shielding member 11 may be made of a desired metal plate such as SUS304 to which a poly olefin coating or heat-resistant Teflon coating is carried out.

Further, it is desirable that other components in the processing chamber 1, such as the introductory pipe 2a for supplying the atmosphere gas (or mist) 6 into the processing chamber 1, and the wafer fixing mechanism 8, be constituted by a material, such as Hastelloy and SUS316L, having high corrosion resistance to the formic acid.

Further, the shielding member 11 may be removable. In this way, the shielding member 11 can be replaced, and the durability of the reflow apparatus can be further improved. Simultaneously, scattering and adhesion of a metal foreign substance onto the IC section of the semiconductor wafer and electronic parts on a circuit board can be prevented such that a product with high quality and reliability can be manufactured.

Figure 4:
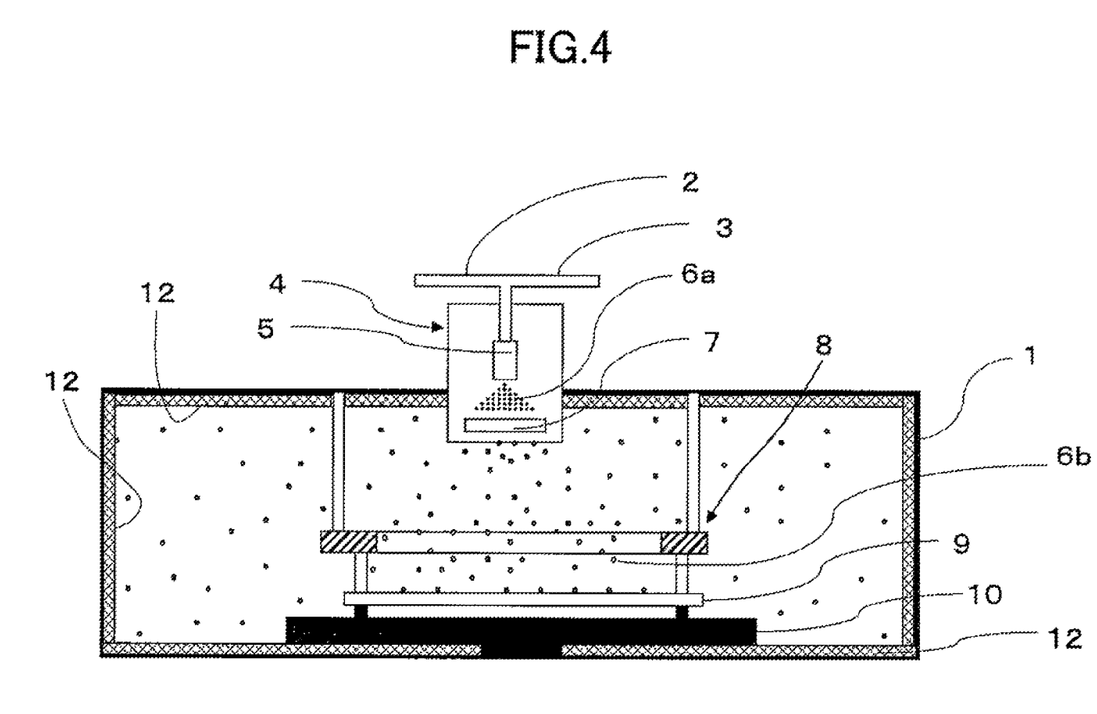
FIG. 4 is a cross-sectional diagram of the reflow apparatus according to the second embodiment of the present invention.

FIG. 4 shows the reflow apparatus according to the second embodiment of the present invention. In the second embodiment, a heater 12 for formic acid decomposition is installed in the place of the shield board 11 of the first embodiment, the heater covering the inner surface of the wall of the processing chamber 1. As for the heater 12 for formic acid decomposition, one that is thin and flexible is desired such as a seeds heater and a micro heater.

By covering the inner surface of the wall of the processing chamber 1 with the heater 12 for formic acid decomposition, thermolysis of the atmosphere gas 6b containing the formic acid adhering to the inner wall takes place. The atmosphere gas 6b containing formic acid is decomposed by heating above 200° C., and thereby, separating the reaction product of formic acid and chamber material is prevented.

It is desirable that the heater 12 for formic acid decomposition be turned on when the reflow process is completed. The reflow process includes spraying the formic acid atmosphere gas, removing an oxide film on the surface of the solder electrode on the wafer 9, and forming a bump electrode by the thermal fusion. Since the surface of the solder is cleaned using the reduction action of the formic acid while performing the reflow process, the residual formic acid adhering to the shielding member or the chamber material is removed by heating decomposition above 200° C. after the reflow process is completed so that corrosion is prevented.

The second embodiment also provides a reflow apparatus wherein corrosion by the formic acid is effectively prevented, and adhesion of a foreign substance on the processing target, such as an integrated circuit device on a wafer or electronic parts on a circuit board, is prevented without vastly changing the structure of the conventional processing chamber. Since other units are the same as those of the first embodiment shown in the FIG. 2, explanations thereof are omitted.

Figure 5:
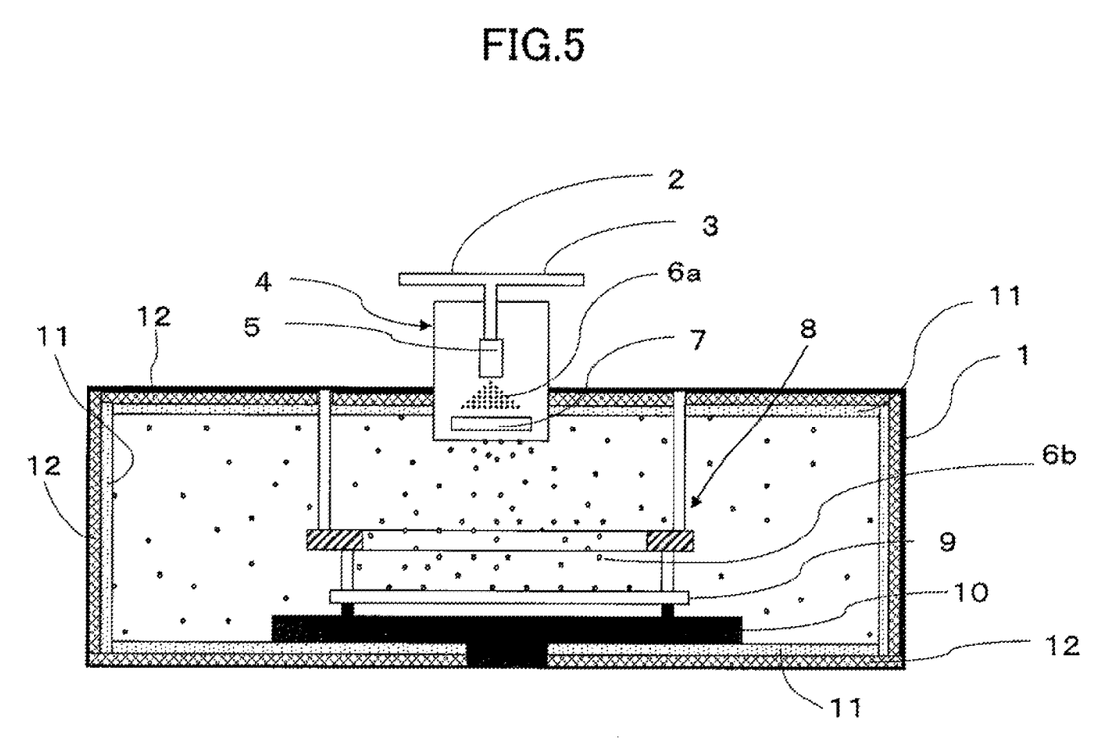
FIG. 5 is a cross-sectional diagram of the reflow apparatus according to the third embodiment of the present invention.

FIG. 5 shows the reflow apparatus according to the third embodiment of the present invention. According to the third embodiment, both the shielding member 11 and the heater 12 for formic acid decomposition are used.

It is desirable that the heater 12 for formic acid decomposition be provided between the inner wall of the processing chamber 1 and the shielding member 11. In this way, the heater 12 for formic acid decomposition heats the shielding member 11 to 200° C. or higher, and the formic acid atmosphere gas 6b adhering to the shielding member 11 can be decomposed. Thereby, corrosion of the shielding member 11 that has an excellent corrosion resistance by itself can be further prevented.

Although using one of the shielding member 11 and the heater 12 for formic acid decomposition prevents the corrosion of the inner wall of the processing chamber 1, as described in the first embodiment and the second embodiment, the durability of the reflow apparatus can be further improved by combining them, further improving the quality of the product.

Figure 6A:
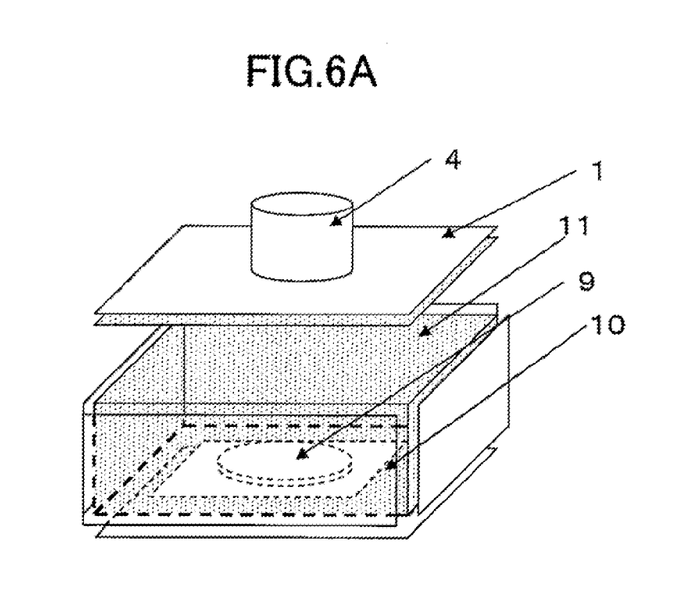
FIGS. 6A, 6B, and 6C are exploded perspective diagrams of the reflow apparatus according to the first, the second, and the third embodiments, respectively, of the present invention.
Figure 6B:
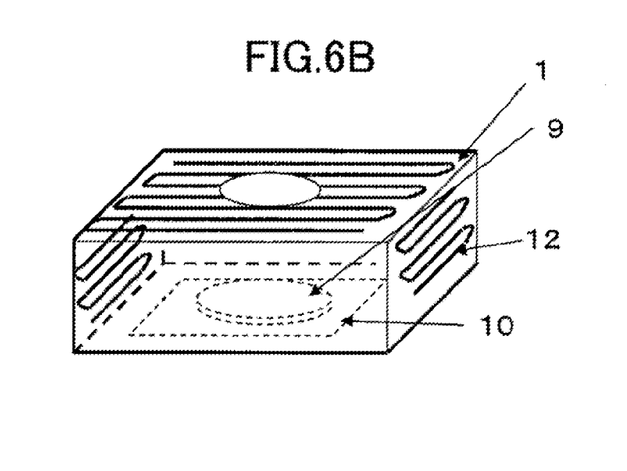
Figure 6C:
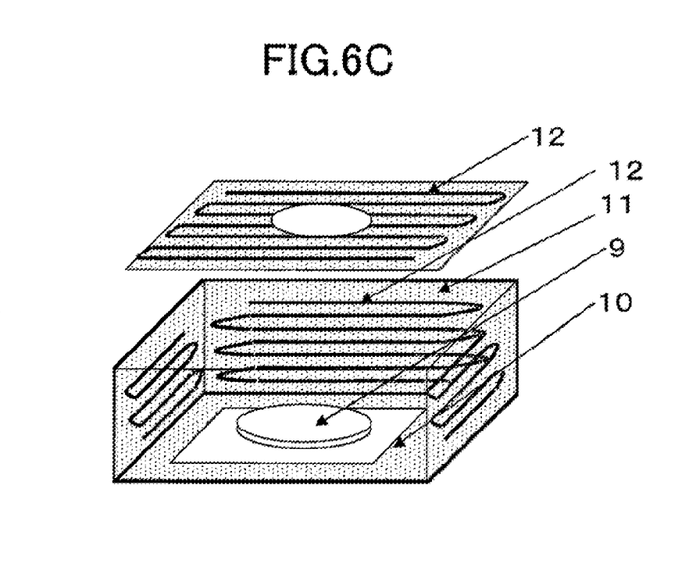

FIGS. 6A, 6B, and 6C are exploded perspective diagrams of the reflow apparatus according to the first, the second, and the third embodiments, respectively, as described above. FIG. 6A shows the reflow apparatus of the first embodiment wherein the shielding member 11 is arranged over the whole surface near the inner wall of the processing chamber 1. The main heater 10 for heating the wafer 9 is arranged in a space surrounded by the shielding member 11, and the wafer 9 is held above the main heater 10 for heating the wafer. The formic acid atmosphere gas is provided on the wafer 9 by the formic acid sprayer mechanism 4.

FIG. 6B shows the reflow apparatus of the second embodiment wherein the inner wall surface of the processing chamber 1 is covered by the heater 12 for formic acid decomposition.

FIG. 6C shows the reflow apparatus of the third embodiment wherein the heater 12 for formic acid decomposition is sandwiched between the chamber material that constitutes the processing chamber 1 and the shielding member 11.

Since the heating decomposition of the adhering formic acid can be carried out by any configuration of the embodiments above, a reaction between the formic acid and the chamber material or the shielding member 11, as applicable, is suppressed.

Figure 7:
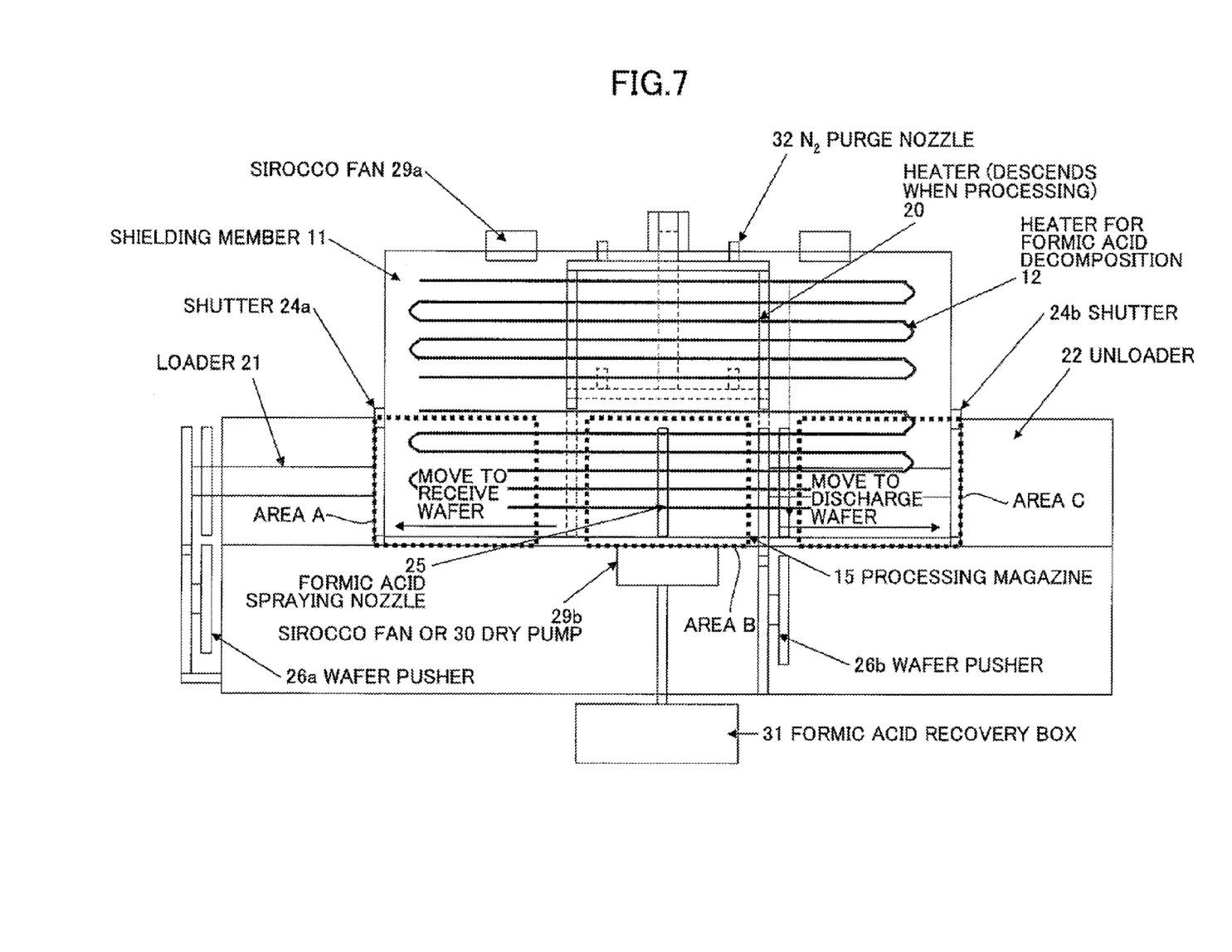
FIG. 7 is a cross-sectional diagram of the reflow apparatus according to the fourth embodiment of the present invention.

FIG. 7 shows the reflow apparatus according to the fourth embodiment of the present invention. The reflow apparatus of the fourth embodiment is capable of carrying out batch processing of two or more semiconductor wafers. The wafers are held by a processing magazine 15, and are conveyed in an oven with the processing magazine 15. The inside of the oven is divided into an area A that is a semiconductor wafer reception area, an area B that is a reflow processing area, and an area C that is a semiconductor wafer taking-out area. The reflow processing area B corresponds to a processing chamber, and the wafer reception area A and the taking-out area C correspond to a main chamber.

The oven is filled with nitrogen ($N_2$). The inner wall surface of the oven is fully covered by the shielding member 11, and the heater 12 for formic acid decomposition is fully spread around between the inner wall and the shielding member 11. The processing magazine 15 carrying the wafers enters the wafer reception area A through a shutter 24a of a loader 21.

A formic acid spraying nozzle 25 is installed in the reflow processing area B. When the processing magazine 15 enters the area B, a heater 20 descends from above, and the wafers conveyed by the processing magazine 15 are simultaneously heated. When a predetermined wafer temperature is reached, the formic acid mist is heated and sprayed from the formic acid spraying nozzle 25. By this, surface cleaning (reduction process) of a solder electrode formed on the wafer and formation of a bump (thermal fusion process) are performed.

When the reflow process is finished, the processing magazine 15 is discharged by an unloader 22 from the wafer discharge area C through a shutter 24b. Near the shutters 24a and 24b of the loader 21 and the unloader 22, respectively, air curtains of nitrogen gas are provided such that the $N_2$ atmosphere in the oven is maintained. The formic acid that may remain is collected into a formic acid recovery box 31.

A sirocco fan 29a that keeps running is provided at an upper part of the oven. One of a sirocco fan 29b and a dry pump 30 located at a lower part of the processing magazine 15 runs at specified times.

When the process is completed, the nitrogen gas is purged from the oven through a purge nozzle 32.

Figure 8:
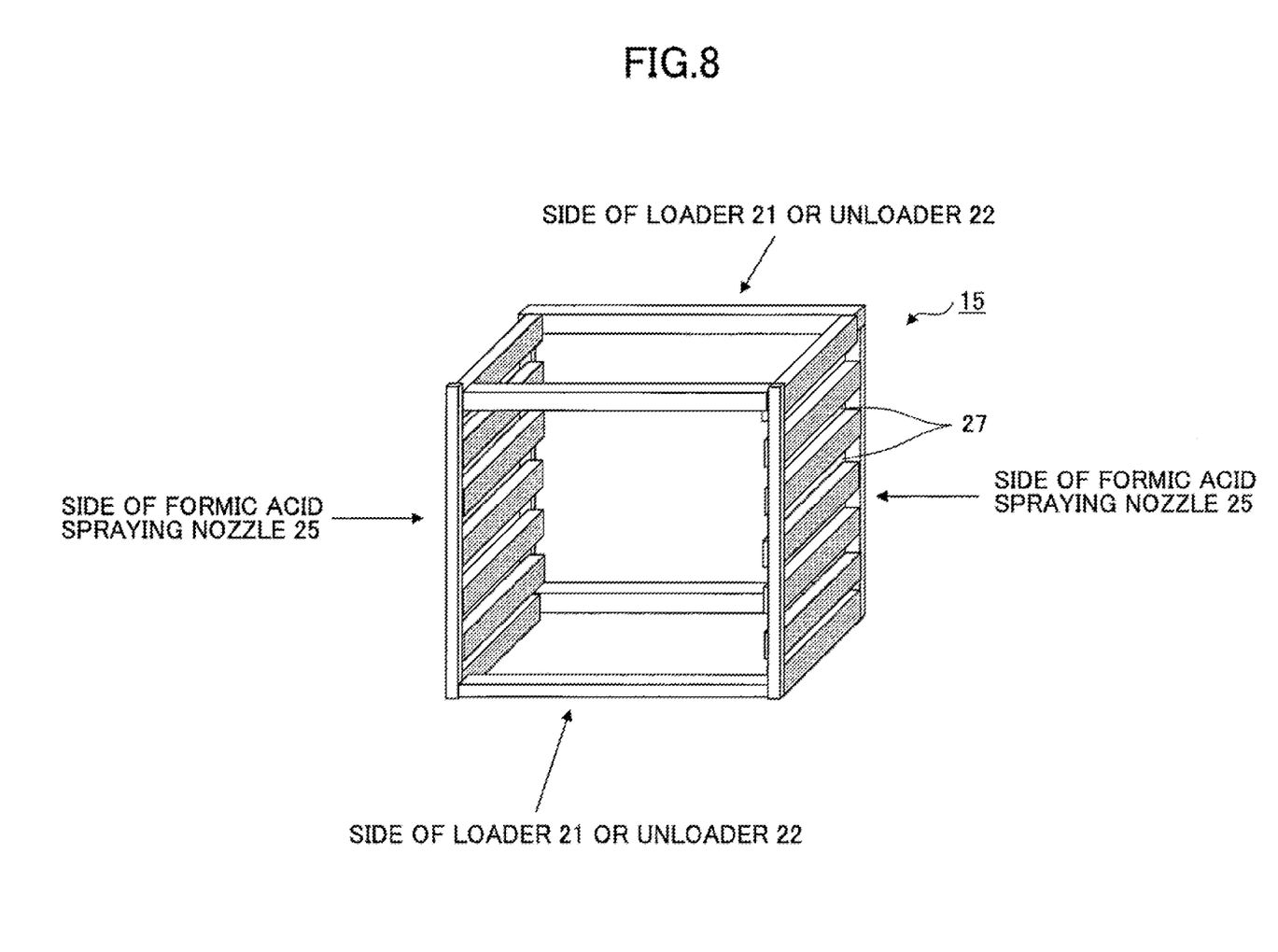
FIG. 8 is a perspective diagram of a processing magazine used with a batch-processing type reflow apparatus of FIG. 7.

FIG. 8 is a perspective diagram of the processing magazine 15 used with the reflow apparatus shown in FIG. 7. The wafers (not illustrated) are held by the processing magazine 15 in parallel with each other. The processing magazine 15 is inserted into the processing chamber such that the wafers may be horizontally positioned (parallel with the oven bottom).

The formic acid gas enters between the wafers through a slit 27 from the side of the formic acid spraying nozzle 25, and the reduction action removes an oxide film on the surface of the solder electrode formed on each semiconductor wafer.

Since the inner wall of the oven is covered by the shielding member 11, and the heater 12 for formic acid decomposition is inserted between the shielding member and the inner wall, even when the batch process is carried out as in the fourth embodiment, residual formic acid gas adhering to the shielding member 11 is decomposed. Thereby, the corrosion of the oven by the formic acid can be prevented, and scattering of metal foreign substance (reaction product) onto the wafers can be prevented. Here, although the example shown in FIG. 7 includes both the shielding member 11 and the heater 12 for formic acid decomposition, sufficient corrosion prevention effect can be attained by using one of them.

Figure 9:
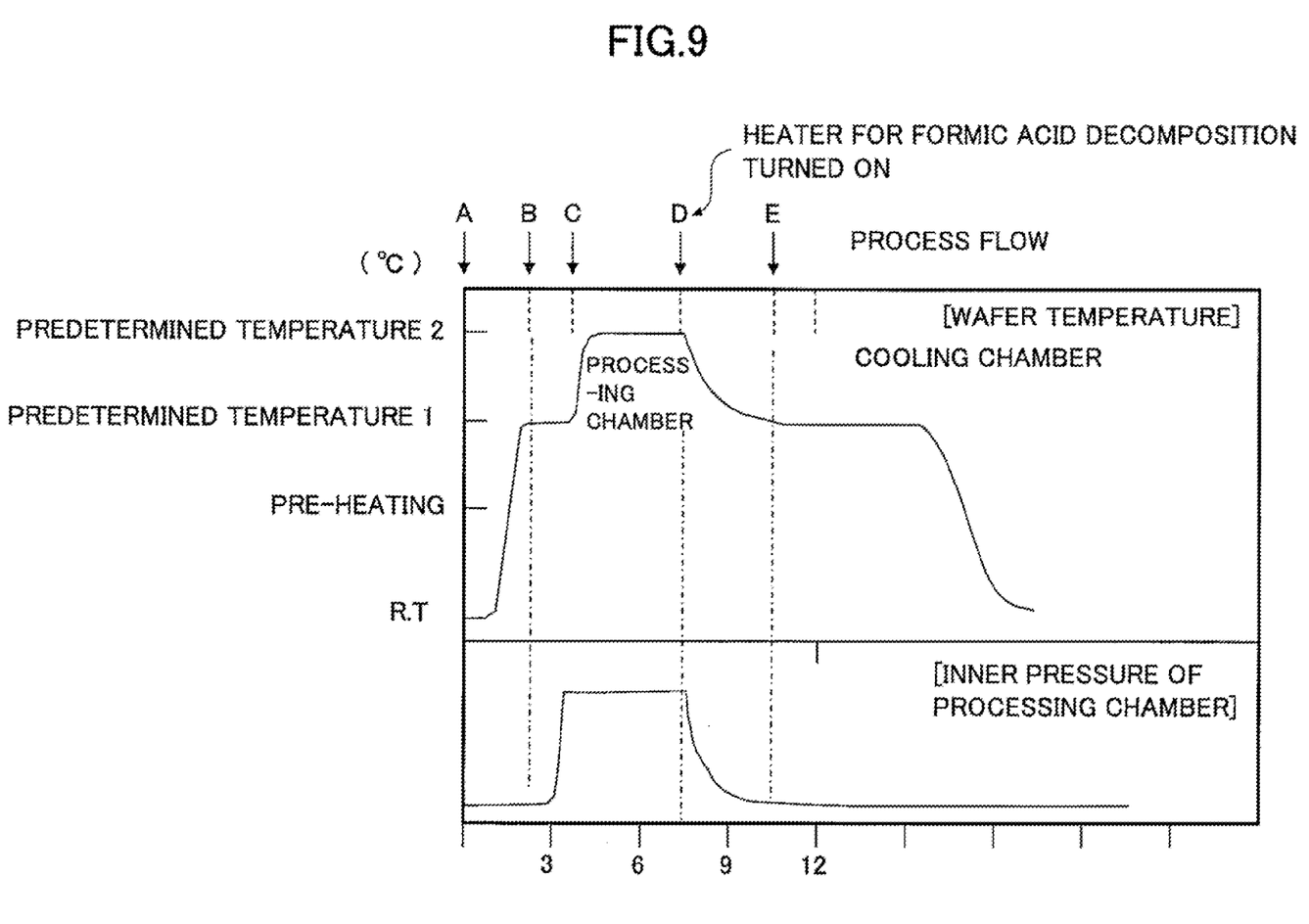
FIG. 9 is a graph showing process timing of the reflow apparatus of the second and third embodiments.

FIG. 9 is a graph showing the process timing of the evacuation (exhaust gas) type reflow apparatus that includes the heater 12 for formic acid decomposition such as the second embodiment and the third embodiment. The upper part of the graph is a temperature profile of the wafer 9, and the lower part of the graph is a pressure profile in the processing chamber 1. The horizontal axis represents time (minutes).

At Timing A, the processing chamber 1 is evacuated to a predetermined pressure, and the wafer 9 is arranged in the processing chamber 1 that is evacuated. The wafer 9 is held on the main heater 10.

When the wafer reaches a predetermined temperature 1 at Timing B, mixed gas of formic acid and nitrogen ($N_2$) (formic acid atmosphere gas) is sprayed, and removal of the oxide film on the solder electrode surface formed on the wafer 9 is started. In the meantime, heating the wafer with the main heater 10 continues. By spraying the formic acid atmosphere gas and heating, the pressure in the processing chamber 1 rapidly rises.

If the wafer reaches a predetermined temperature 2 at Timing C, the solder electrode starts fusing. The wafer is held at the predetermined temperature 2 for several minutes, and the thermal fusion process (reflow) that includes spraying the formic acid atmosphere gas is performed.

When a solder bump formation (reflow) is completed at Timing D, the heater 12 for formic acid decomposition is turned on. Further, the wafer is lowered to the predetermined temperature 1 while opening an exhaust valve for evacuating. Thereby, the pressure in the processing chamber 1 rapidly declines.

Gas evacuating of the processing chamber 1 is continued until the pressure reaches a predetermined level at Timing E. Then, the wafer is moved to a cooling chamber, and the wafer temperature descends to room temperature RT.

Figure 10:
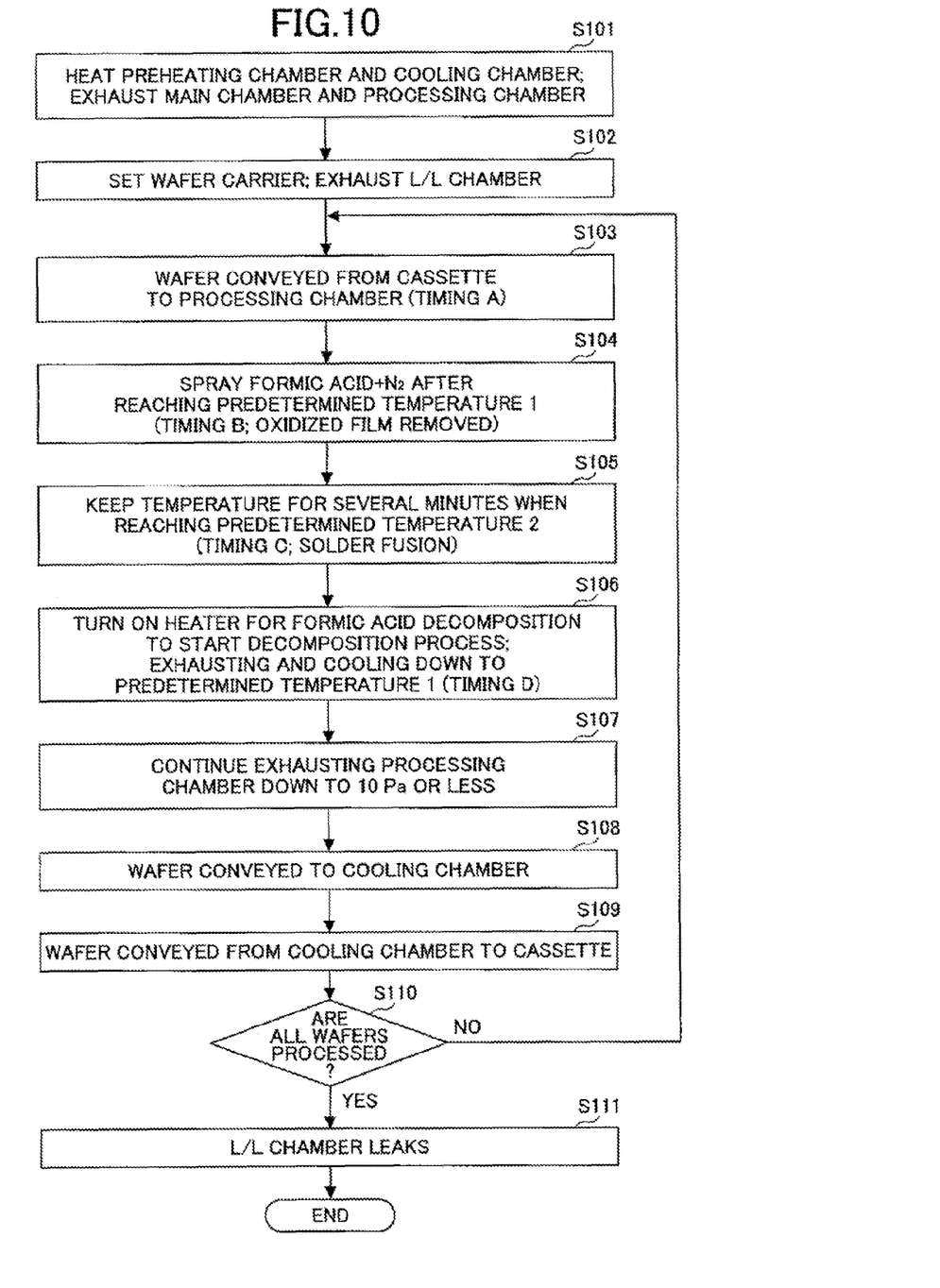
FIG. 10 is a flowchart of a thermal fusion reflow process according to the process timing of FIG. 9.

FIG. 10 is a flowchart showing a reflow process according to the process timing of FIG. 9 performed by the reflow apparatus of FIG. 4 (the second embodiment) and FIG. 5 (the third embodiment).

First, the preheating chamber and the cooling chamber are warmed to corresponding predetermined temperatures at Step S101. Further, the pressure of the main chamber for wafer conveyance and wafer discharge is lowered to about 20 Pa, and the processing chamber 1 is evacuated to a pressure of 10 Pa or less.

Next, at Step S102, a wafer carrier (not illustrated) is introduced, and the load lock (L/L) chamber is evacuated to pressure of 10 Pa or less.

Next, at Step S103, the wafer is conveyed to the processing chamber 1 from a cassette by a robot. This step corresponds to the timing A of FIG. 9.

Next, at Step S104, when the wafer reaches the predetermined temperature 1, the mixed gas of formic acid and nitrogen ($N_2$) is sprayed, and oxide-film removal from the surface of the solder electrode on the wafer 9 is started. This step corresponds to the timing B of FIG. 9.

Next, at Step S105, when the wafer reaches the predetermined temperature 2, the temperature is held for several minutes, and the solder electrode is shaped into the solder bump by the thermal fusion. This step corresponds to the timing C of FIG. 9.

Next, at Step S106, when the solder electrode is shaped into the solder bump under the formic acid atmosphere gas spraying, the heater 12 for formic acid decomposition is turned on, and the decomposition process (thermolysis) of the formic acid that remains and adheres to the processing chamber 1 is started. Simultaneously, the wafer temperature is lowered to the predetermined temperature 1, and the exhaust valve (not illustrated) is opened for evacuation. This step corresponds to the timing D of FIG. 9.

Next, at Step S107, gas evacuation is continued until the pressure inside of the processing chamber 1 becomes 10 Pa or less. This step corresponds to the timing E of FIG. 9.

Next, at Step S108, the wafer 9 is taken out and conveyed to the cooling chamber. At this time, a semiconductor wafer to be processed next is conveyed into the processing chamber 1 from the main chamber.

At Step S109, the wafer cooled to room temperature is conveyed to the cassette.

At Step S110, it is determined whether processing of all the wafers held by the cassette is completed. If the determination is affirmative (YES at S110), the load lock chamber is opened at Step S111, and the process is completed. Otherwise, i.e., if a semiconductor wafer yet-to-be-processed remains in the cassette (NO at S110), the process returns to Step S103 for repeating Steps S103 through S110.

As described above, the heater for formic acid decomposition is turned on so that the thermolysis process of decomposing the formic acid that adheres to the chamber is carried out after fusion shaping of the solder electrode in the formic acid atmosphere. Thereby, scattering the formic acid and producing a reaction product of the formic acid can be effectively prevented.

Although the present invention is described above based on specific embodiments, the present invention is not limited to the embodiments. According to the embodiments, the reflow apparatus is used for forming the solder bump electrode on the wafer; nevertheless, the reflow apparatus can be used, for example, for bonding a solder bump formed on a desired substrate to a terminal or a pad of a wiring circuit board.

Further, the present invention can be applied to, for example, a reflow process of a solder section formed on an electrode section of a circuit board or an interposer that is made of an insulating resin (such as glass epoxy) or ceramics, at least on a surface of which, wiring and an electrode are arranged.

Further, the present invention can be applied to solder fixing a semiconductor integrated circuit element or other electronic parts to an electrode on the circuit board or the interposer.

Further, the present invention is not limited to these embodiments, but variations and modifications may be made without departing from the scope of the present invention.

The present application is based on Japanese Priority Application No. 2005-319819 filed on Nov. 2, 2005 with the Japanese Patent Office, the entire contents of which are hereby incorporated by reference.

What is claimed is:

1. A reflow method, comprising:
   heating, with a first heater, a processing target on which a solder member is mounted;
   supplying an atmosphere gas containing formic acid to the processing target when the processing target reaches a first temperature; performing a fusion process on the solder member when the processing target reaches a second temperature; and
   performing a thermolysis process of decomposing the formic acid, with a second heater, when the fusion process performed on the solder member is completed;
   wherein the second heater is located on an upper inner wall and on a bottom inner wall and on a side inner wall of a processing chamber, and a shield member fully covering the second heater.

2. A manufacturing method of manufacturing a semiconductor device, comprising:
   placing and heating, with a first heater, a processing target that has a solder electrode in a predetermined position in a processing chamber;
   supplying an atmosphere gas containing formic acid to the processing chamber when the processing target reaches a first temperature;
   forming the solder electrode into a solder bump by thermal fusion when the processing target reaches a second temperature; and
   performing a thermolysis process of decomposing the formic acid with a second heater, and lowering the temperature of the processing target to the first temperature after formation of the solder bump;
   wherein the second heater is located on an upper inner wall and on a bottom inner wall and on a side inner wall of the processing chamber, and a shield member fully covering the second heater.

3. The reflow method as claimed in claim 1, wherein the thermolysis process of decomposing the formic acid is performed at a temperature equal to or greater than 200° C.

4. The reflow method as claimed in claim 1,
wherein the first heater is located below the processing target; and the second heater is located on the inner wall of the processing chamber.

5. The manufacturing method as claimed in claim 2, wherein the first heater is located below the processing target; and the second heater is located on the inner wall of the processing chamber.

* * * * *